(12) United States Patent
Hanna et al.

(10) Patent No.: US 7,709,830 B2
(45) Date of Patent: May 4, 2010

(54) ORGANIC SEMICONDUCTOR STRUCTURE, MANUFACTURING METHOD OF THE SAME, AND ORGANIC SEMICONDUCTOR DEVICE

(75) Inventors: Junichi Hanna, Yokohama (JP); Hiroaki Iino, Abiko (JP); Hiroki Maeda, Tokyo (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 0 days.

(21) Appl. No.: 11/092,174

(22) Filed: Mar. 29, 2005

(65) Prior Publication Data

US 2006/0113526 A1    Jun. 1, 2006

(30) Foreign Application Priority Data

Mar. 31, 2004    (JP) .............................. 2004-108591

(51) Int. Cl.
    *H01L 29/08* (2006.01)
(52) U.S. Cl. ................... 257/40; 257/E51.005
(58) Field of Classification Search ............ 257/40, 257/288, 388, E51.005, E51.006; 349/123, 349/177; 438/82, 99
    See application file for complete search history.

(56) References Cited

U.S. PATENT DOCUMENTS 6,614,501 B1 *  9/2003  Moriyama et al. .......... 349/177

2001/0026340 A1 * 10/2001 Hasegawa et al. ........... 349/123
2005/0127354 A1 *  6/2005 Hanna et al. ................. 257/40

OTHER PUBLICATIONS

Y. -Y. Lin, D.J. Gundlach, S. Nelson, and T.N. Jackson, "Stacked Pentacene Layer Organic Thin-Film Transistors with Improved Characteristics", IEEE Electron Device Lett, 18,606 (1997).

* cited by examiner

*Primary Examiner*—Thomas L Dickey
*Assistant Examiner*—Fazli Erdem
(74) *Attorney, Agent, or Firm*—Ladas & Parry LLP

(57) ABSTRACT

An organic semiconductor device Including an organic semiconductor layer in a crystallized crystal state is disclosed. The organic semiconductor layer is formed from an organic semiconductor material including a liquid crystal molecule. The semiconductor material has properties capable of exhibiting a supercooled state during a phase transition process, in which a phase having no periodic regularity is capable of being transferred into a phase having periodic regularity at a location of a center of gravity in between the liquid crystal molecules. The phase having no periodic regularity at a location of a center of gravity In between the liquid crystal molecules is a nematic liquid crystal phase and the phase having periodic regularity at a location of a center of gravity in between the liquid crystal molecules is a crystal phase.

3 Claims, 5 Drawing Sheets

ORGANIC SEMICONDUCTOR STRUCTURE, MANUFACTURING METHOD OF THE SAME, AND ORGANIC SEMICONDUCTOR DEVICE

BACKGROUND OF THE INVENTION

1. Field of the Invention

The present invention relates to an organic semiconductor structure comprising an organic semiconductor layer formed with organic semiconductor material having liquid crystallinity, a manufacturing method of the same and an organic semiconductor device.

2. Description of the Related Art

As a typical example of an organic semiconductor device, an organic field-effect transistor (also called organic FET) using an organic semiconductor as an active layer (hereinafter, referred to as an organic semiconductor layer) can be mentioned. In order to realize a thin film-large area device, the organic FET is required to have uniform charge transport property over a sufficient large area.

In this organic FET, the organic semiconductor layer is formed, by vacuum deposition process, from molecular crystals represented by pentacene (see Y.-Y. Lin, D. J. Gundlach, S. Nelson, and T. N. Jackson, "Stacked Pentacene Layer Organic Thin-Film Transistors with Improved Characteristics", IEEE Electron Device Lett, 18, 606 (1997)).

However, the organic semiconductor layers formed by the above-mentioned vacuum deposition process generally have characteristics that a large number of grain boundaries easily occur in polycrystalline state of aggregated fine crystals, and further, defects easily occur so that such grain boundaries and defects inhibit transportation of charge. Accordingly, when an organic semiconductor layer is to be formed by vacuum deposition process, it is actually very difficult to form an organic semiconductor layer serving as an element of an organic semiconductor device continuously with uniform performance over a sufficiently large area.

SUMMARY OF THE INVENTION

The present invention is achieved in order to solve the above-described problems. The object of the present invention is to provide an organic semiconductor structure, a manufacturing method of the same and an organic semiconductor device, comprising an organic semiconductor layer having uniform charge transport property over relative large area, which is conventionally said to be difficult.

A manufacturing method of an organic semiconductor structure, wherein the organic semiconductor structure comprises an organic semiconductor layer formed from an organic semiconductor material having a liquid crystal molecule in at least one part, the liquid crystalline organic semiconductor material exhibits a supercooled state during a phase transition process, in which a phase having no periodic regularity at a location of a center of gravity in between the liquid crystal molecules is transferred into a phase having periodic regularity at a location of a center of gravity in between the liquid crystal molecules, and also, the phase of the material is transferred from said supercooled state to the phase having periodic regularity at a location of a center of gravity in between the liquid crystal molecules, in a temperature raising process from the phase having no periodic regularity at a location of a center of gravity in between the liquid crystal molecules, the liquid crystalline organic semiconductor material exhibiting the phase having no periodic regularity at a location of a center of gravity in between the liquid crystal molecules is cooled, maintaining the supercooled state, to a temperature lower than a temperature of which the phase is transferred to the phase having periodic regularity at a location of a center of gravity in between the liquid crystal molecules, and after the phase transition to the phase having periodic regularity at a location of a center of gravity in between the liquid crystal molecules is started, the material is turned into a state that the phase having periodic regularity at a location of a center of gravity in between the liquid crystal molecules is a thermodynamically stable phase and the phase having no periodic regularity at a location of a center of gravity in between the liquid crystal molecules is a thermodynamically metastable phase, and the organic semiconductor layer is formed by maintaining said state until the liquid crystalline organic semiconductor material is turned into a state exhibiting the phase having periodic regularity at a location of a center of gravity in between the liquid crystal molecules.

In the present invention, the liquid crystalline organic semiconductor material is turned into a state (hereinafter, this may be referred to as "state I"), in which a phase having periodic regularity at a location of a center of gravity in between the liquid crystal molecules (hereinafter, this may be referred to as "regulated phase") is a thermodynamically stable phase and a phase having no periodic regularity at a location of a center of gravity in between the liquid crystal molecules (hereinafter, this may be referred to as "unregulated phase") is a thermodynamically metastable phase, and then, the state is maintained. Thus, phase transition from the unregulated phase to the regulated phase can be gradually carried out, and speed of the phase transition can be reduced. As a result, for example, there will be few structural defects in a large area so that it is easy to form an organic semiconductor layer showing uniform charge transport property. Moreover in the present invention, in a temperature raising process from the unregulated phase, the liquid crystalline organic semiconductor material in a state exhibiting unregulated phase is turned into the state I after the material is supercooled to a temperature lower than a temperature that the phase transition to the regulated phase begins. Therefore, the liquid crystalline organic semiconductor material can be turned into the state I easily.

In the manufacturing method of an organic semiconductor structure of the present invention, it is preferable that: (A) the phase having no periodic regularity at a location of a center of gravity in between the liquid crystal molecules is a nematic liquid crystal phase and the phase having periodic regularity at a location of a center of gravity in between the liquid crystal molecules is a crystal phase; (B) the phase having no periodic regularity at a location of a center of gravity in between the liquid crystal molecules is a nematic liquid crystal phase and the phase having periodic regularity at a location of a center of gravity in between the liquid crystal molecules is a smectic liquid crystal phase; (C) the phase having no periodic regularity at a location of a center of gravity in between the liquid crystal molecules is an isotropic phase and the phase having periodic regularity at a location of a center of gravity in between the liquid crystal molecules is a smectic liquid crystal phase.

To solve the above-described problems, the organic semiconductor structure of the present invention comprises an organic semiconductor layer formed from an organic semiconductor material having a liquid crystal molecule in at least one part, wherein the organic semiconductor layer exhibits a phase having periodic regularity at a location of a center of gravity in between the liquid crystal molecules, and the liquid crystalline organic semiconductor material has properties of exhibiting a supercooled state during a phase transition process, in which a phase having no periodic regularity at a location of a center of gravity in between the liquid crystal molecules is transferred into a phase having periodic regularity at a location of a center of gravity in between the liquid crystal molecules, and also, the phase of the material is transferred from said supercooled state to the phase having periodic regularity at a location of a center of gravity in between the liquid crystal molecules.

In the present invention, while in the supercooled state, the liquid crystalline organic semiconductor material forming the organic semiconductor layer exhibits unregulated phase, in which freedom of molecular mobility is high. Therefore, during the phase transition from the unregulated phase to the regulated phase, the liquid crystal molecule in the liquid crystalline organic semiconductor material is likely to move to the optimal position. Thus, for example, since the organic semiconductor layer being formed of crystal with few structural defects, it is easy to uniformalize the charge transport property so that it contributes greatly to the realization of the thin film-large area device.

In the organic semiconductor structure of the present invention, it is preferable that: (E) the phase having no periodic regularity at a location of a center of gravity in between the liquid crystal molecules is a nematic liquid crystal phase and the phase having periodic regularity at a location of a center of gravity in between the liquid crystal molecules is a crystal phase; (F) the phase having no periodic regularity at a location of a center of gravity in between the liquid crystal molecules is a nematic liquid crystal phase and the phase having periodic regularity at a location of a center of gravity in between the liquid crystal molecules is a smectic liquid crystal phase; (G) the phase having no periodic regularity at a location of a center of gravity in between the liquid crystal molecules is an isotropic phase and the phase having periodic regularity at a location of a center of gravity in between the liquid crystal molecules is a smectic liquid crystal phase.

In the organic semiconductor structure of the present invention, it is preferable that an alignment layer is further provided, and the organic semiconductor layer is formed on the alignment layer.

In the present invention, by aligning the liquid crystal molecule in the organic semiconductor layer in a specific direction or orientation, the charge transport property of the organic semiconductor layer can be uniformalized.

In order to solve the above-described problems, the organic semiconductor device of the present invention comprises at least a substrate, a gate electrode, a gate-insulating layer, an organic semiconductor layer in crystal state, a drain electrode, and a source electrode, wherein the organic semiconductor layer is formed from an organic semiconductor material comprising a liquid crystal molecule, and exhibits a phase having periodic regularity at a location of a center of gravity in between the liquid crystal molecules, and the liquid crystalline organic semiconductor material has properties of exhibiting a supercooled state during a phase transition process, in which a phase having no periodic regularity at a location of a center of gravity in between the liquid crystal molecules is transferred into a phase having periodic regularity at a location of a center of gravity in between the liquid crystal molecules, and also, the phase of the material is transferred from said supercooled state to the phase having periodic regularity at a location of a center of gravity in between the liquid crystal molecules.

In the present invention, since the organic semiconductor layer constituting the organic semiconductor device exhibits uniformalized charge transport property in between the drain electrode and the source electrode, this can contribute greatly to the realization of the thin film-large area device.

In the organic semiconductor device of the present invention, it is preferable that: (H) the phase having no periodic regularity at a location of a center of gravity in between the liquid crystal molecules is a nematic liquid crystal phase and the phase having periodic regularity at a location of a center of gravity in between the liquid crystal molecules is a crystal phase; (I) the phase having no periodic regularity at a location of a center of gravity in between the liquid crystal molecules is a nematic liquid crystal phase and the phase having periodic regularity at a location of a center of gravity in between the liquid crystal molecules is a smectic liquid crystal phase; (J) the phase having no periodic regularity at a location of a center of gravity in between the liquid crystal molecules is an isotropic phase and the phase having periodic regularity at a location of a center of gravity in between the liquid crystal molecules is a smectic liquid crystal phase.

In the organic semiconductor device of the present invention, it is preferable that: (K) the drain electrode and the source electrode are formed on the gate-insulating layer so that the drain electrode and the source electrode are facing to each other, the organic semiconductor layer is formed in between the drain electrode and the source electrode, and the liquid crystal molecule in the liquid crystalline organic semiconductor material is aligned in parallel to a film thickness direction of the drain electrode and the source electrode; (L) the drain electrode and the source electrode are formed on the gate-insulating layer so that the drain electrode and the source electrode are facing to each other, the organic semiconductor layer is formed in between the drain electrode and the source electrode, and the liquid crystal molecule in the liquid crystalline organic semiconductor material is aligned in orthogonal to a film thickness direction of the drain electrode and the source electrode, also standing abreast in between the drain electrode and the source electrode.

According to the manufacturing method of an organic semiconductor structure of the present invention, it is easy to form the organic semiconductor layer having few structural defects over a large area. Therefore, it is easy to obtain the organic semiconductor structure comprising the organic semiconductor layer having uniformalized charge transport property over a large area.

Further, according to the organic semiconductor structure and the organic semiconductor device of the present invention, since it is easy to uniformalize the charge transport property of the organic semiconductor layer over a large area, this can contribute greatly to the realization of the thin film-large area device.

DESCRIPTION OF THE PREFERRED EMBODIMENT

Figure 1:
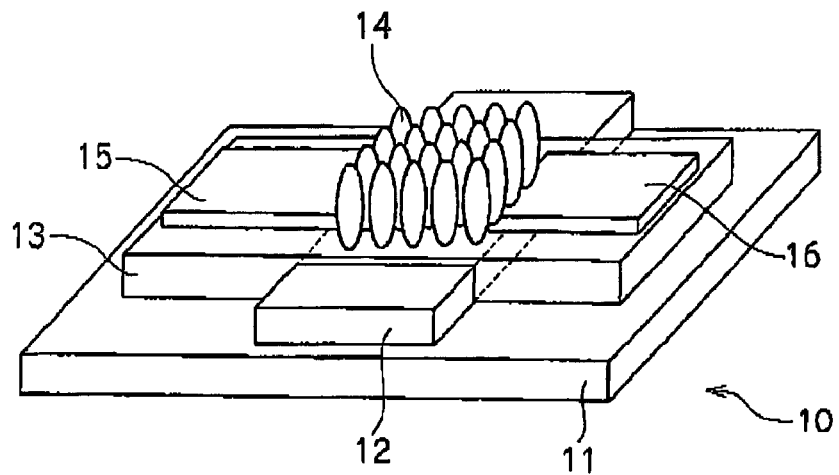
FIG. 1 is a sectional view showing one example of the organic semiconductor device of the present invention.

Hereinafter, the organic semiconductor structure, manufacturing method of the same and the organic semiconductor device of the present invention are described by referring to the drawings.

<Organic Semiconductor Structure>

The organic semiconductor structure of the present invention comprises an organic semiconductor layer formed from a liquid crystalline organic semiconductor material (hereinafter, this may be referred to as organic semiconductor material) in at least one part, and its organic semiconductor layer is in a state exhibiting a phase having periodic regularity at a location of a center of gravity in between the liquid crystal molecules.

(Organic Semiconductor Layer)

The organic semiconductor material used in the present invention is formed from liquid crystal molecule shown in chemical formula 1 described below,

B-A-B'      1

In the above chemical formula, "A" represents a core part having skeletal structure comprising L-unit of 6π-electron system ring, M-unit of 8π-electron system ring, N-unit of 10π-electron system ring, O-unit of 12π-electron system ring, P-unit of 14π-electron system ring, Q-unit of 16π-electron system ring, R-unit of 18π-electron system ring, S-unit of 20π-electron system ring, T-unit of 22π-electron system ring, U-unit of 24π-electron system ring and V-unit of 26π-electron system ring (wherein L, M, N, O, P, Q, R, S, T, U and V each represent an integer of 0 to 12, and L+M+N+O+P+Q+R+S+T+U+V=1 to 12). Moreover, B and B' in the above chemical formula represent a chain structure with high flexibility or functional group such as hydrogen and halogen.

Referring to "A" of the liquid crystal molecule shown in the above chemical formula 1, the 6π-electron system ring includes, for example, a benzene ring, furan ring, thiophene ring, pyrrole ring, 2H-pyran ring, 4H-thiopyran ring, pyridine ring, oxazole ring, isoxazole ring, thiazole ring, isothiazole ring, furazane ring, imidazole ring, pyrazole ring, pyrazine ring, pyrimidine ring, pyridazine ring and troboron ring. The 8π-electron system ring includes, for example, a pentalene ring, indene ring, indolizine ring and 4H-quinoline ring. The 10π-electron system ring includes, for example, a naphthalene ring, azulene ring, benzofuran ring, isobenzofuran ring, 1-benzothiophene ring, 2-benzothiophene ring, indole ring, isoindole ring, 2H-chromene ring, 1H-2-benzopyran ring, quinoline ring, isoquinoline ring, 1,8-naphthyridine ring, benzimidazole ring, 1H-indazole ring, benzoxazole ring, benzothiazole ring, quinoxaline ring, quinazoline ring, cinnoline ring, pteridine ring, purine ring and phthalazine ring. The 12π-electron system ring includes, for example, a heptalene ring, biphenylene ring, as-indacin ring, s-indacin ring, acenaphthylene ring, fluorene ring and phenalene ring. The 14π-electron system ring includes, for example, a phenanthrene ring, anthracene ring, carbazole ring, xanthene ring, acridine ring, phenanthridine ring, pyrimidine ring, 1,10-phenanthroline ring, phenazine ring, phenarsazine ring and tetrathiafulvalene ring. The 16π-electron system ring includes, for example, a fluoranthene ring, acephenanthrylene ring, aceanthrylene ring, pyrene ring, thianthrene ring, phenoxathiine ring, phenoxazine ring and phenothiazine ring. The 18π-electron system ring includes, for example, a triphenylene ring, chrysene ring, naphthacene ring and pleiadene ring. The 20π-electron system ring includes, for example, a perylene ring. The 22π-electron system ring includes, for example, a piceine ring, pentaphene ring and pentacene ring. The 24π-electron system ring includes, for example, a tetraphenylene ring and coronene ring. The 26π-electron system ring includes, for example, a hexaphene ring, hexacene ring and rubicene ring.

Among the liquid crystal molecules shown in the above chemical formula 1, the liquid crystalline organic semiconductor materials used in the present invention are those having at least one kind of liquid crystal state at a temperature of not higher than the thermal decomposition temperature thereof. The phrase "at a temperature of not higher than the thermal decomposition temperature thereof" means that the material is in such a state that the material itself is not decomposed. The thermal decomposition temperature varies depending on the material used. The phrase "those having at least one kind of liquid crystal state" means that a material having at least one kind of liquid crystal state is used. For example, in smectic liquid crystal phase (hereinafter, also referred to as Sm) described later have plural kinds of liquid crystal states such as SmA phase, SmB phase, SmC phase, etc., and the material referred to the above is meant to have at least one kind of such liquid crystal states. As such liquid crystal molecules, liquid crystal molecules of which "A" in the above chemical formula 1 having skeletal structure shown in the following chemical formulae 2 to 36 can be listed.

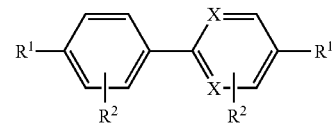

2

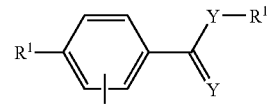

3

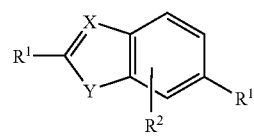

4

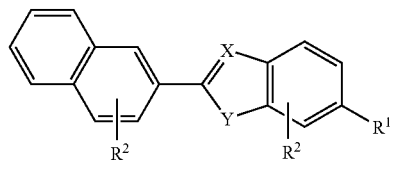

5

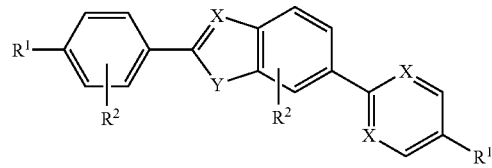

6

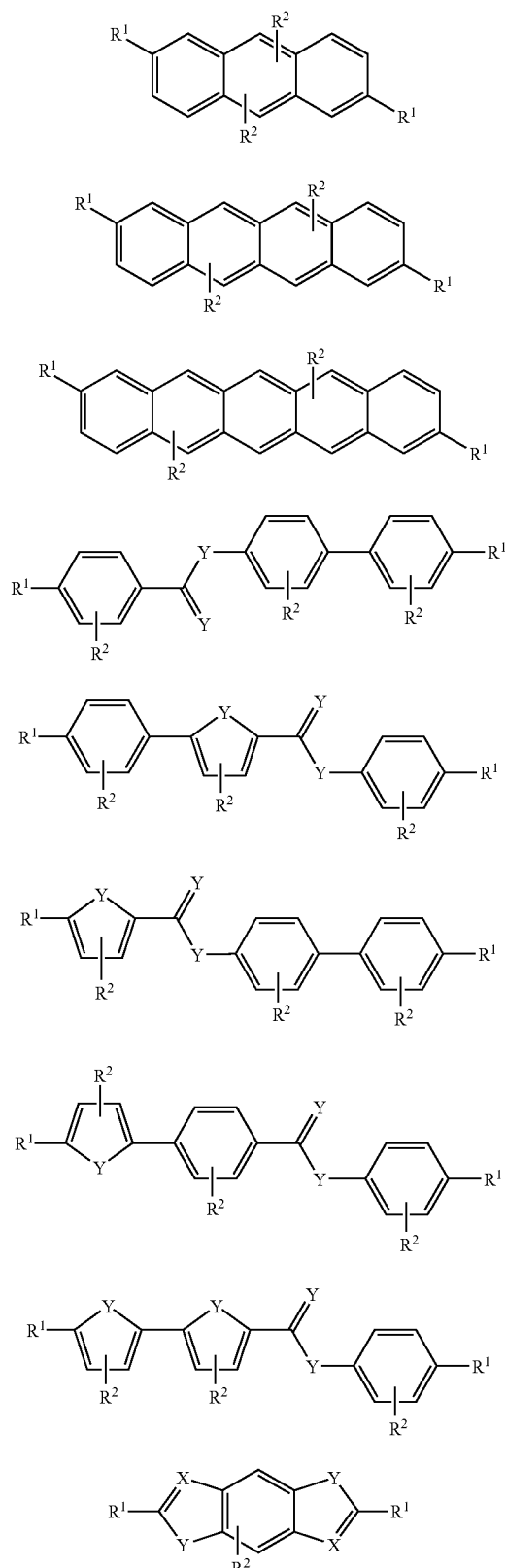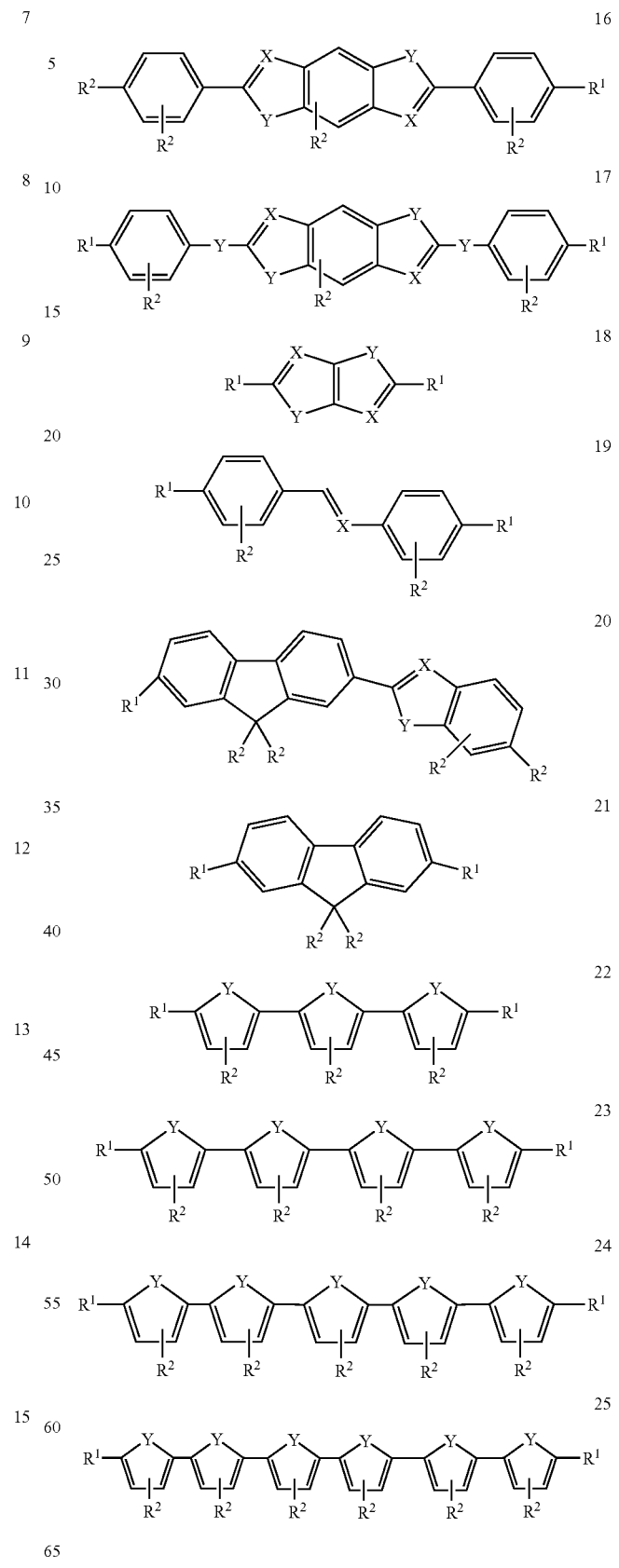

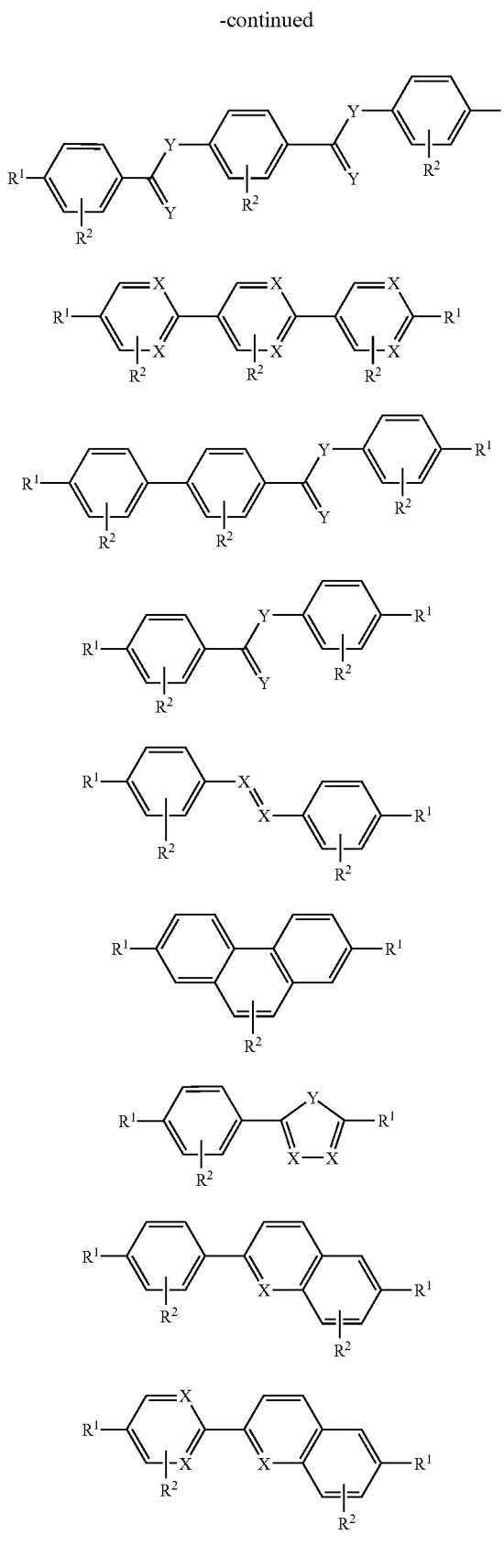

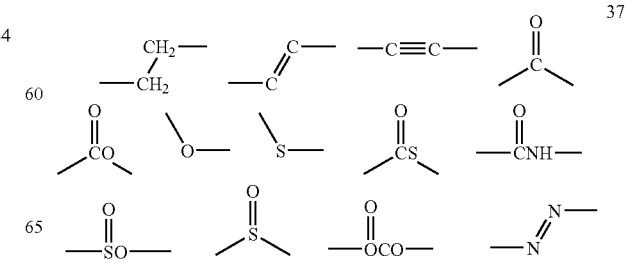

R[1] in the above chemical formulae 2 to 36 represents a divalent structure shown in the chemical formula 37 below, which is a linking group for linking with another skeleton. When a plurality of R[1]s are present in these liquid crystal molecules, the R[1]s may be the same or different. R[1] may not be present in the liquid crystal molecules. R[2] in the above chemical formulae 2 to 36 represents a functional group shown in the chemical formula 38 below. When a plurality of R[2]s are present in these liquid crystal molecules, the R[2]s may be the same or different. X in the above chemical formulae 2 to 36 represents CH or N, and Y in the above chemical formulae 2 to 36 represents S or O.

B and B' in the above chemical formula 1 is a chain structure with high flexibility or a functional group such as hydrogen and halogen. The chain structure with high flexibility is basically a linear alkyl chain or branched alkyl chain, and this alkyl chain may contain a structure selected from the group of 39 divalent structures shown in the chemical formula 37 below. The chain structure with high flexibility may be consisting of structures selected from the group of 39 divalent structures shown in the chemical formula 37 below. In this case, the chain structure with high flexibility may be composed of one structure selected from the group, or may be composed of a plurality of structures, which are selected from the group, linked in a linear or branched form. These chain structures with high flexibility may have a functional group selected from the group of 21 functional groups illustrated as substituent groups in the chemical formula 38 below. In cases in which B and B' in the above chemical formula 1 do not have the chain structure with high flexibility, they will be one of the 21 functional groups shown in the chemical formula 38 below -continued

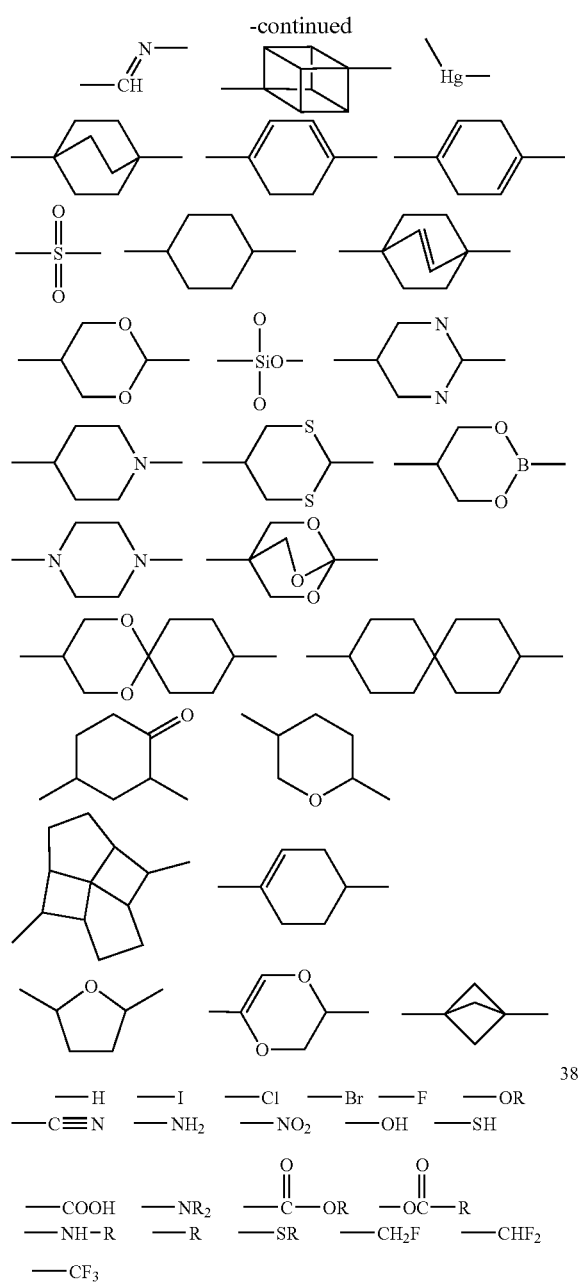

38

R in the above chemical formula 38 represents linear or branched alkyl group of 1 to 40 carbon atoms.

Among the above-described organic semiconductor material formed from liquid crystal molecule, the organic semiconductor material used in the present invention has characteristics of exhibiting supercooled state during the phase transition process from the unregulated phase to the regulated phase, and also, the phase of the material is transferred from this supercooled state to the regulated phase. The "unregulated phase" refers to "a phase having no periodic regularity at a location of a center of gravity in between the liquid crystal molecules", and the "regulated phase" refers to "a phase having periodic regularity at a location of a center of gravity in between the liquid crystal molecules".

The phrase "having periodic regularity at a location of a center of gravity in between the liquid crystal molecules" refers to the presence of, at a location of a center of gravity in between the liquid crystal molecules, periodic regularity in the major axis direction of the liquid crystal molecule or periodic regularity in the minor axis direction of the liquid crystal molecules. When the organic semiconductor material has the regularity only in the major axis direction of liquid crystal molecules at the location of the center of gravity in between the liquid crystal molecules, the liquid crystal molecules are aligned in a layered state, and come to be in a low-order smectic liquid crystal state. Further, when the organic semiconductor material also has the regularity in the minor axis direction of liquid crystal molecules at the location of the center of gravity in between the liquid crystal molecules, the regularity of the distance between the liquid crystal molecules is increased, and as the regularity in the minor axis direction increases, the organic semiconductor material comes to be in a higher-order smectic liquid crystal state and finally in a crystal state.

The phrase "having no periodic regularity at a location of a center of gravity in between the liquid crystal molecules" refers to the absence of periodic regularity in the major axis direction and periodic regularity in the minor axis direction of liquid crystal molecules at the location of the center of gravity in between the liquid crystal molecules. Such organic semiconductor layer having no regularity at the location of the center of gravity in between the liquid crystal molecules comes to be in a nematic liquid crystal state having the regularity only in the direction of molecule alignment or in an isotropic state having no regularity in it alignment direction either.

In the below-described forming method, since the organic semiconductor layer formed from the organic semiconductor material having such characteristics that undergoes phase transition from the unregulated phase, thorough supercooling, to the regulated phase, liquid crystal molecules in the unregulated phase having high degree of freedom of molecular mobility can move easily to the optimum position upon phase transition. As a result, the organic semiconductor layer has few structural defects over a large area.

In this specification, the "supercooled state" refers to a state wherein, when the temperature of phase transition from the unregulated phase to the regulated phase in a temperature raising process is referred to as the phase transition temperature A, the phase transition from the unregulated phase to the regulated phase does not completely occur and the original unregulated phase is still maintained even if the temperature is lowered to a temperature lower than the phase transition temperature A. In the supercooled state, the regulated phase may be coexistent in a part of the unregulated phase. In this specification, the term "supercooling" refers to cooling while maintaining the supercooled state, and the term "supercooling process" refers to a process of cooling while maintaining the supercooled state.

Preferable examples of such organic semiconductor materials include: a material having properties of exhibiting the supercooled state in the process of phase transition from a nematic liquid crystal phase to a crystal phase and showing phase transition from this supercooled state to the crystal phase (also referred to as material 1); a material having properties of exhibiting the supercooled state in the process of phase transition from a nematic liquid crystal phase to a smectic liquid crystal phase and showing phase transition from this supercooled state to the smectic liquid crystal phase (also referred to as material 2); and a material having properties of exhibiting the supercooled state in the process of phase transition from an isotropic phase to a smectic liquid crystal phase and showing phase transition from this supercooled state to the smectic liquid crystal phase (also referred to as material 3).

When the regulated phase is the smectic liquid crystal phase, it is preferably the smectic liquid crystal phase of higher-order. In the higher-order smectic liquid crystal phase, alignment regularity of liquid crystal molecule is so high that the charge mobility of the organic semiconductor layer can be increased. When the regulated phase of the organic semiconductor material is the smectic liquid crystal phase, the organic semiconductor material may be transferred to the crystal phase in some cases at the temperature of which the organic semiconductor device is used. Also in this case, in this organic semiconductor material, there is few alignment regularity disturbance over a large area, and comes into a crystal state through phase transition from the smectic liquid crystal phase wherein liquid crystal molecules hardly freely. Therefore, structural defects in the organic semiconductor layer can be reduced over a large area.

In the present invention, the organic semiconductor material having unregulated phase during the supercooling process can be used. That is, for example, in the temperature raising process from the crystal phase, the phase of the material 1 may be transferred to the smectic liquid crystal phase.

The organic semiconductor material used in the present invention includes, for example, liquid crystal molecule compounds represented by the following chemical formula 47. These compounds are those having properties of exhibiting the supercooled state in the process of phase transition from the nematic liquid crystal phase to the crystal phase and showing phase transition from this supercooled state to the crystal phase (material 1).

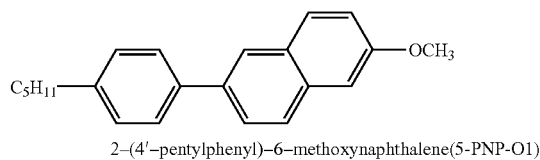

2-(4'-pentylphenyl)-6-methoxynaphthalene(5-PNP-O1)

Moreover, for the organic semiconductor material used in the present invention, for example, the liquid crystal molecule compound represented by the following chemical formula 40 can be listed. This compound is the one having properties of exhibiting the supercooled state in the process of phase transition from the isotropic phase to the smectic liquid crystal phase and showing phase transition from this supercooled state to the smectic liquid crystal phase (material 3).

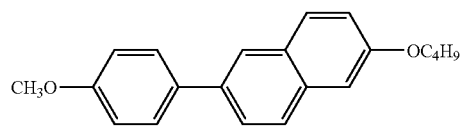

Further, for the organic semiconductor material used in the present invention, for example, the liquid crystal molecule compound represented by the following chemical formula 48 can be listed. This compound is the one having properties of exhibiting the supercooled state in the process of phase transition from the nematic liquid crystal phase to the smectic liquid crystal phase and showing phase transition from this supercooled state to the smectic liquid crystal phase (material 2).

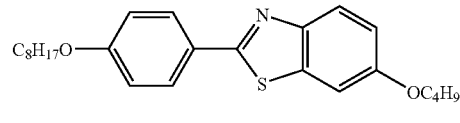

2-(4'-octyloxyphenyl)-6-butyloxybenzothiazole(8O-PBT-O4)

The organic semiconductor layer in the organic semiconductor structure of the present invention is formed by: cooling the liquid crystalline organic semiconductor material having unregulated phase to the temperature lower than the phase transition temperature A while maintaining the supercooled state; after the phase transition to the regulated phase is started, the material is turned into a state (hereinafter, this state is referred to as state I) that the regulated phase is a thermodynamically stable phase, and the unregulated phase is a thermodynamically metastable phase; and the above-described state is maintained until the material obtains the regulated phase.

In such forming method, since the state, that the regulated phase is a thermodynamically stable phase and the unregulated phase is a thermodynamically metastable phase, is maintained during the phase transition of the liquid crystalline organic semiconductor material from the unregulated phase to the regulated phase, the phase transition from the unregulated phase to the regulated phase is gradually carried out. Further, in this thermodynamically metastable unregulated phase, degree of freedom of the liquid crystal molecule mobility is high so that it can be easily moved. Therefore, the liquid crystal molecule can move to the optimal position before the phase transition to the regulated phase is completed. For this reason, the organic semiconductor layer having few structural defects over a large area can be obtained. Here, in a case the regulated phase is the smectic liquid crystal phase, the phrase "having few structural defects" means that there are few disturbance in alignment regularity of the liquid crystal molecule.

Moreover, since the temperature that the regulated phase becomes the thermodynamically stable phase and the unregulated phase becomes the thermodynamically metastable phase (hereinafter, this temperature is referred to as temperature B) is normally lower than the phase transition temperature A, the state I can be easily obtained by supercooling the organic semiconductor material to the temperature lower than the temperature A for one time, before the temperature of the material is made at temperature B. If the organic semiconductor material is phase transferred from the unregulated phase to the regulated phase without going through the supercooled state, the phase transition is rapidly carried out so that the state I can hardly obtained. After the phase transition to the regulated phase has started, by cooling while maintaining the supercooled state, the material is made into the state I by raising the temperature normally.

Hereinafter, the method for forming this organic semiconductor layer will be explained in detail, referring to an example that the material having properties of exhibiting the supercooled state in the process of phase transition from the nematic liquid crystal phase to the crystal phase and showing phase transition from this supercooled state to the crystal phase (material 1). In this case, the obtained organic semiconductor layer will be in crystal state.

The above-described organic semiconductor layer in crystal state is formed by: coating etc. the liquid crystalline organic semiconductor material on a surface on which the organic semiconductor layer is formed; after turning the liquid crystalline organic semiconductor material into the nematic liquid crystal state, lowering the temperature to the temperature lower than the phase transition temperature from the nematic liquid crystal phase to the crystal phase, while maintaining the supercooled state; when the crystallization has started, the liquid crystalline organic semiconductor material is turned into a state that the crystal phase is a thermodynamically stable phase and the liquid crystal phase is a metastable phase; and maintaining the state until the liquid crystalline organic semiconductor material is in the crystal state.

In such method for forming the organic semiconductor layer, as described above, since the speed of crystallization is slow and the liquid crystal molecule can move easily until the crystallization, the organic semiconductor layer with few structural defects over a large area can be obtained.

Further, in such method for forming the organic semiconductor layer, the temperature of the organic semiconductor material in the nematic liquid crystal state is lowered while maintaining the supercooled state, and when the crystallization has started, the material is brought into the state I by raising the temperature to the temperature B. Therefore, as described above, by raising the temperature when the crystallization has started, growth of the crystal nucleus is inhibited because the progress of the crystallization of the organic semiconductor material is suppressed. For this reason, the crystal nucleus existing, when the phase is transferred from the nematic liquid crystal phase to the crystal phase, can be reduced so that large single crystals can be easily obtained. Therefore, the organic semiconductor layer with few structural defects over a large area can be obtained. From the viewpoint of inhibiting the growth of the crystal nucleus, it is preferable that the temperature is raised immediately after the crystallization of the cooled organic semiconductor material is started.

The coating etc. of the organic semiconductor material to the surface, on which the organic semiconductor layer is formed, is carried out by: a method that the organic semiconductor material is coated to the surface, on which the organic semiconductor layer is formed, in the isotropic state or in the liquid crystal state; or a method that the organic semiconductor material is vapor deposited (including PVC method and CVD method) on the surface on which the organic semiconductor layer is formed. By the method that the organic semiconductor material is coated to the surface, on which the organic semiconductor layer is formed, in the isotropic state or in the liquid crystal state, the organic semiconductor layer having more uniformed charge transport property over a larger area can be formed extremely easily. For the coating method in this case, various coating methods and printing methods can be used.

When the organic semiconductor material is brought into the nematic liquid crystal state, it is preferable that the crystal phase, which can be crystal nucleus, is not coexisting in the liquid crystal phase of the organic semiconductor material. Therefore, it is preferable that the material is turned into the nematic liquid crystal state, after the organic semiconductor material is turned into the isotropic state, by lowering the temperature to the temperature at which the organic semiconductor material exhibits liquid crystal state. If the crystal phase is coexisting in the organic semiconductor material in the nematic liquid crystal state, a large quantity of crystal nucleus exist, at the time when the organic semiconductor material is supercooled and the crystallization starts, large crystals with few structural defects can hardly be obtained.

The lowering of the temperature, to the temperature lower than the phase transition temperature A, of the organic semiconductor material formed on the surface on which the organic semiconductor material is formed, is preferably carried out slowly so that the organic semiconductor material can be crystallized at high temperature as possible. The lowering speed of the temperature is preferably 0.1° C./min or higher, and 1° C./min or lower.

The speed of raising the temperature of the organic semiconductor material to the temperature B is preferably 10° C./min or higher, and 20° C./min or lower. When the speed of raising the temperature to the temperature B is lower than 10° C./min, the crystallization of the organic semiconductor material is easily carried out because the speed of raising the temperature is too slow, so that the speed of the crystallization is easily increased. Moreover, when the speed of raising the temperature to the temperature B is higher than 20° C./min, the temperature of the organic semiconductor material can easily be over the temperature B because the speed of raising the temperature is too fast.

The temperature B differs depending on the kind of the organic semiconductor material used to form the organic semiconductor layer. For example, the temperature B of the organic semiconductor material formed of the liquid crystal molecule shown in the above chemical formula 47 is about 120° C. Further, the temperature at which the crystallization of the organic semiconductor material formed of this liquid crystal molecule starts, from the supercooled state, is about 105° C. Therefore, in case of forming the organic semiconductor layer using the organic semiconductor material formed from this liquid crystal molecule, it is preferable that: the organic semiconductor material is turned into the nematic liquid crystal state in which the crystal phase dose not coexist; after that, the temperature is raised to around 105° C. at the speed of 1° C./min; immediately after the crystallization has started, the temperature is raised to around 120° C. at the speed of 20° C./min, and this temperature is maintained. The organic semiconductor layer obtained as described above will be in the crystal state with few structural defects over a large area. The organic semiconductor layer formed as described above has crystal grain diameter of 1 to 5 mm.

Further, when the material having properties of exhibiting the supercooled state in the process of phase transition from the nematic liquid crystal phase to the smectic liquid crystal phase and showing phase transition from this supercooled state to the smectic liquid crystal phase (material 2), or the material having properties of exhibiting the supercooled state in the process of phase transition from the isotropic phase to the smectic liquid crystal phase and showing phase transition from this supercooled state to the smectic liquid crystal phase (material 3) is used as the organic semiconductor material, the organic semiconductor layer with few structural defects over a large area can be obtained by the similar methods.

Moreover, in the organic semiconductor structure of the present invention, the organic semiconductor layer in the crystal state can be formed by: coating etc. the liquid crystalline organic semiconductor material on the surface on which the organic semiconductor layer is formed; after lowering the temperature of the coated film to the temperature B, only a part of the coated film, on a plain view, is cooled to be crystallized; after that, heating the entire surface of the coated film uniformly, or maintaining the temperature of the entire surface of the coated film as it is. When only a part of the coated film is cooled, a temperature slopes, in a range from the temperature of which the crystallization progresses to the temperature B, in the direction of the coated film surface. Therefore, on the plain view of the coated film, a part where its temperature is at the temperature of starting crystallization exists in the coated film. The temperature of the part, where its temperature is at the temperature of starting crystallization, will be raised to the temperature B by heating the entire surface of the coated film, so that large crystal with few structural defects can be obtained. Moreover, when the temperature of the entire surface is maintained as it is, because the heat of the high temperature part of the coated film diffuses, the temperature of the part where its temperature is at the temperature of starting crystallization will be raised to the temperature B, so that large crystal with few structural defects can be obtained. As a method for sloping the temperature in the direction of the surface by crystallizing a part of the coated film, the following methods can be listed: a method in which, after the temperature of the coated film of the organic semiconductor material is lowered to the temperature B, the crystallization is induced by contacting a low-temperature body to a part of the coated film; and a method in which, after the temperature of the coated film is lowered to the temperature B, at the time of raising the temperature of the coated film by a heat source, a part of the coated film is kept away from being contacted to the heat source. In the latter method, the temperature of the part, which is kept away from being contacted to the heat source, will be decreasing for a certain period of time and the part will be crystallized.

The organic semiconductor layer in the organic semiconductor structure of the present invention obtained as described above has few structural defects over a large area, so that it has highly uniformalized charge transport property over a large area.

(Liquid Crystal Alignment Means of the Organic Semiconductor Material)

In the organic semiconductor structure of the present invention, the above-described organic semiconductor layer is preferably formed from the liquid crystalline organic semiconductor material aligned in a specific direction or orientation by alignment means.

The alignment means includes a means that involves forming a liquid crystal alignment layer on a surface on which the liquid crystalline organic semiconductor material is to be formed (for example, the surface of a gate-insulating layer described later), and then subjecting it to alignment treatment such as rubbing treatment, or a means in which the liquid crystalline organic semiconductor material is brought into contact with a layer subjected to an alignment treatment. By such alignment means, the liquid crystal molecule of the liquid crystalline organic semiconductor material can be formed so that it is aligned in a specific direction or orientation. Therefore, unique function or electrical property can be exhibited according to the direction or orientation of the alignment.

By these alignment means, the liquid crystalline organic semiconductor material is preferably either: laminated and aligned on the liquid crystal alignment layer comprising a polyimide-based material; or laminated and aligned on the liquid crystal alignment layer a curing resin having minute unevenness on the surface thereof.

In the organic semiconductor structure of the present invention, various liquid crystal alignment layers can be used. However, it is preferable that the liquid crystal alignment layer is one of the following: a layer prepared by coating a polyimide-based material and then subjecting it to rubbing treatment; a layer comprising a curing resin having minute unevenness; or a layer comprising a curing resin having minute unevenness wherein the liquid crystal alignment layer and the base material are integrated. The liquid crystal alignment layer can be aligned in an external field such as an electric field or a magnetic field.

Particularly, as a typical example of the liquid crystal alignment layer, those prepared by coating a polyimide-based resin and then subjecting to rubbing treatment can be mentioned. Besides this polyimide-based material, the material can include resin materials such as acrylate, polychloropyrene, polyethylene terephthalate, polyoxymethylene, polyvinyl chloride, polyvinylidene fluoride, cyanoethyl pullulan, polymethyl methacrylate, polysulfone, polycarbonate, polyimide and the like. These materials can be classified, depending on their types, into those having an ability to be aligned vertically to the liquid crystal and those having an ability to be aligned horizontally to the liquid crystal. Specific means of coating includes spin coating method, casting method, pulling method and the like. Such liquid crystal alignment layer can be disposed in between a substrate and the organic semiconductor layer, or on an overcoat layer on the organic semiconductor layer.

The layer comprising a curing resin having minute unevenness can be formed, for example, by forming a layer comprising a curing resin and then rubbing the surface of the layer, or by depressing a shaping member, capable of forming minute unevenness, onto the surface of the curing resin which is not yet cured and then curing the resin layer. The surface of the cured resin thus obtained has minute unevenness formed thereon, so that the liquid crystal molecule of the liquid crystalline organic semiconductor material can be aligned in that direction. As the curing resin, acrylic UV-curing resin, fluorine-based UV-curing resin and the like can be listed. It is particularly preferable that the liquid crystal alignment layer comprising the cured resin having minute unevenness is formed as an integrated body with a substrate.

The minute unevenness in this case is composed of minute grooves formed in a same direction. The depth of a groove in this unevenness is about 0.01 to 1.0 μm, preferably about 0.03 to 0.3 μm, and the width of the groove is about 0.05 to 1.0 μm, and the pitch between adjacent grooves is about 0.1 to 2.0 μm. When the depth of the groove is less than 0.01 μm, the liquid crystal molecules cannot be correctly aligned, while when the depth is greater than 1.0 μm, the alignment of the liquid crystal may be disturbed at the edge of the groove. When the width of the groove is less than 0.05 μm, the grooves are hardly produced, while when the width is greater than 1.0 μm, the alignment force in the middle of the groove may be lowered. When the pitch among the grooves formed is less than 0.1 μm, the grooves are hardly produced, while when the pitch is greater than 2.0 μm, there easily occurs disturbance in alignment of the liquid crystal.

In the organic semiconductor structure of the present invention, as the first embodiment of the liquid crystal alignment layer, ones having a substrate, the liquid crystal alignment layer and the organic semiconductor layer laminated in this order can be mentioned. As the second embodiment of the liquid crystal alignment layer, ones having a substrate and the organic alignment layer laminated in this order can be mentioned. As the third embodiment of the liquid crystal alignment layer, ones having a substrate, the liquid crystal alignment layer, the organic semiconductor layer and the liquid crystal alignment layer laminated in this order can be mentioned. In the present invention, as described above, since the organic semiconductor layer is constituted so as to be contacted with the layer subjected to alignment treatment, the liquid crystal molecule constituting the liquid crystalline organic semiconductor material can be imparted with high alignment property.

<Organic Semiconductor Device>

Figure 2:
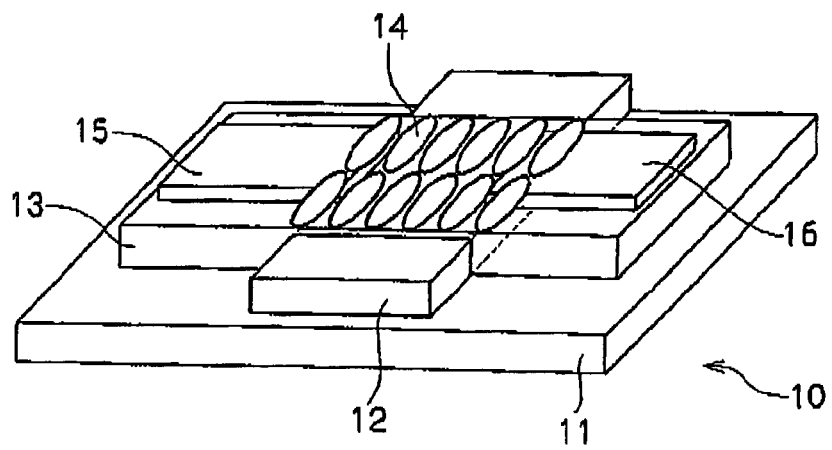
FIG. 2 is a sectional view showing another example of the organic semiconductor device of the present invention.

As shown in FIG. 1 and FIG. 2, the organic semiconductor device 10 of the present invention is composed of at least substrate 11, gate electrode 12, gate-insulating layer 13, organic semiconductor layer 14 in the crystal state comprising the aligned liquid crystalline organic semiconductor material, drain electrode 15 and source electrode 16. In the organic semiconductor device 10, the organic semiconductor layer 14 in the crystal state is formed from the organic semiconductor material constituting the organic semiconductor structure of the above-described present invention.

Examples of the constitution include: a reverse-staggered structure constituted of, on the substrate 11, the gate electrode 12, gate-insulating layer 13, organic semiconductor layer 14 in the crystal state comprising aligned liquid crystalline organic semiconductor material, drain electrode 15, source electrode 16 and protective layer (not shown in the figures) in this order; and a coplanar structure constituted of, on the substrate 11, the gate electrode 12, gate-insulating layer 13, drain electrode 15, source electrode 16, organic semiconductor layer 14 in the crystal state comprising aligned liquid crystalline organic semiconductor material and a protective layer (not shown in the figure) in this order. The organic semiconductor device 10 thus constituted is actuated in either one of an accumulated and empty state, depending on the polarity of voltage applied to the gate electrode 12.

(Substrate)

The substrate 11 can be selected from a wide variety of insulating materials. Examples of such materials include: inorganic materials such as glass and calcined alumina; and various kinds of insulating materials such as polyimide film, polyester film, polyethylene film, polyphenylene sulfide film and polyparaxylene film. Particularly, a film comprising a polymer compound is extremely useful because it can be used to produce a lightweight and flexible organic semiconductor device. The thickness of substrate 11 used in the present invention is about 25 μm to 1.5 mm.

(Gate Electrode)

The gate electrode 12 is preferably an electrode consisting of an organic material such as polyaniline, polythiophene etc., or an electrode formed by coating conductive ink. Since these electrodes can be formed by coating organic material or the conductive ink, there is an advantage that the electrode formation process is very easy. Specific means of coating includes spin coating method, casting method, pulling method, etc.

The electrode may be formed by conventional photolithography method. In this case, the following can be used as material for forming electrodes: metals such as gold, platinum, chromium, palladium, aluminum, indium, molybdenum, nickel and the like; alloys of these metal; and inorganic materials such as polysilicon, amorphous silicon, tin oxide, indium oxide, indiumtin oxide (ITO) and the like. Two or more of these materials can be simultaneously used.

The thickness of the gate electrode is preferably about 50 to 1000 nm depending on the electric conductivity of its material. The lower limit of thickness of the gate electrode varies according to the electric conductivity of the electrode material and adhesion to a bedding substrate. The upper limit of thickness of the gate electrode should be in such a range that, upon providing the below-mentioned gate-insulating layer and a pair of source/drain electrodes, insulating coverage by the gate-insulating layer at a portion with a level difference, between the bedding substrate and the gate electrode, is sufficient. Also, it is necessary that an electrode pattern formed thereon should not be disconnected. Particularly, when a flexible substrate is used, stress balance should be taken into consideration.

(Gate-Insulating Layer)

The gate-insulating layer 13 is, similar to the gate electrode 12 described above, preferably formed by coating the organic material. As the organic material to be used, polychloropyrene, polyethyleneterephthalate, polyoxymethylene, polyvinyl chloride, polyvinylidene fluoride, cyanoethyl pullulan, polymethylmethacrylate, polysulfone, polycarbonate, polyimide and the like can be listed. Specific means of coating includes spin coating method, casting method, pulling method and the like.

Further, conventional patterning process such as CVD method can be used. In this case, inorganic materials such as $SiO_2$, $SiN_x$ and $Al_2O_3$ are preferably used. Two or more of these materials can be simultaneously used.

Since the mobility in the organic semiconductor device depends on the strength of an electric field, the thickness of the gate-insulating layer is preferably about 50 to 200 mm. Withstand voltage at the time is desirably 2 MV/cm or higher.

(Drain Electrode and Source Electrode)

The drain electrode 15 and source electrode 16 are preferably formed from metal of high work function. This is because the charge transporting carrier in the liquid crystalline organic semiconductor material is a hole, ohmic contact with the organic semiconductor layer 14 is necessary. The work function used herein is a potential difference necessary for taking an electron out of a solid, and is defined as a value that a difference in energy between vacuum level and fermi level is divided by a charge quantity. The work function is preferably about 4.6 to 5.2 eV, and specific materials include gold, platinum, a transparent conductive film (indium tin oxide, indium zinc oxide, etc.). The transparent conductive film can be formed by sputtering method or electron beam (EB) deposition.

The thickness of the drain electrode 15 and source electrode 16 used in the present invention is about 50 to 100 nm.

(Organic Semiconductor Layer)

The organic semiconductor layer 14 is a layer formed from the liquid crystalline organic semiconductor material, which is in a state of exhibiting the regulated phase. Specific organic semiconductor material and method for forming organic semiconductor layer are as described above.

Also, the alignment treatment, liquid crystal alignment layer and the like of the organic semiconductor material are as described above. That is, in the present invention, since the liquid crystalline organic semiconductor material is used, its liquid crystal molecule is aligned in a specific direction or orientation by the above-described alignment treatment. Compared to conventionally known organic semiconductor layer, the organic semiconductor layer 14 which is made into the crystal phase by alignment treatment has excellent effects that: there is no crack occurrence and the like; has uniformed charge transport property; and there is no harmful effect of deterioration of charge transporting speed due to cracks.

As the alignment of the liquid crystal molecule, there are embodiments such as: (a) as shown in the FIG. 1, an embodiment in which the liquid crystal molecule is aligned in parallel to a film thickness direction of the drain electrode 15 and the source electrode 16 formed on the gate-insulating layer 13; or (b) as shown in the FIG. 2, an embodiment in which the liquid crystal molecule is aligned in orthogonal to a film thickness direction of the drain electrode 15 and the source electrode 16 formed on the gate-insulating layer 13, also standing abreast in between the drain electrode 15 and the source electrode 16.

The organic semiconductor layer thus formed has peculiar effect that there are few structural defects over a large area. With this peculiar effect, the organic semiconductor device exhibits an excellent effect that it has uniform charge transport property over a large area. Therefore, for example, this can contribute to the realization of a thin film-large area device such as electronic paper.

In a case that the surface on which the liquid crystalline organic semiconductor material is formed is the gate-insulating layer or the substrate, the gate-insulating layer or the substrate can be integrated with the alignment treatment layer by carrying out the rubbing treatment to the gate-insulating layer or the substrate.

The thickness of the alignment controlling layer is desirably in a range which dose not disturb the ohmic contact of the drain electrode 15/source electrode 16 and the organic semiconductor layer 14 (0.5 to 10 nm).

(Interlayer-Insulating Layer)

The organic semiconductor device 10 is desirably provided with an interlayer-insulating layer. When the drain electrode 15 and source electrode 16 are formed on the gate-insulating layer 13, the interlayer-insulating layer is formed for the purpose of preventing pollution of the surface of the gate electrode 12. Accordingly, the interlayer-insulating layer is formed on the gate-insulating layer 13 prior to the formation of the drain electrode 15 and source electrode 16. After the source electrode 15 and drain electrode 16 are formed, the interlayer-insulating layer is processed such that a part of the layer, disposed on the upper channel region, is completely or partially removed. The region of the interlayer-insulating layer to be removed is desirably similar to the size of the gate electrode 12.

The material constituting the interlayer-insulating layer includes inorganic materials such as silicone oxide, silicone nitride and aluminum oxide, and organic materials such as polychloropyrene, polyethylene terephthalate, polyoxymethylene, polyvinyl chloride, polyvinylidene fluoride, cyanoethyl pullulan, polymethylmethacrylate, polysulfone, polycarbonate, and polyimide.

(Organic Semiconductor Device)

The organic semiconductor device of the present invention can be: (Formation 1) substrate/gate electrode/gate-insulating layer (also serving as an liquid crystal alignment layer)/source-drain electrodes/liquid crystalline organic semiconductor layer (/protective layer); (Formation 2) substrate/gate electrode/gate-insulating layer/source-drain electrodes/liquid crystal alignment layer/liquid crystalline organic semiconductor layer (/protective layer); (Formation 3) substrate/gate electrode/gate-insulating layer (also serving as a liquid crystal alignment layer)/liquid crystalline organic semiconductor layer/source-drain electrodes (patterning)/protective layer; or (Formation 4) substrate/source drain electrodes/liquid crystalline organic semiconductor layer/gate-insulating layer/gate electrode/substrate (also serving as a protective layer).

For such organic semiconductor device, it is easy to prepare by, after forming a cell structure, injecting the liquid crystal by capillary phenomenon and crystallizing the liquid crystalline organic semiconductor material by slowly cooling. However, the organic semiconductor material may be formed by vapor deposition.

EXAMPLES

Hereinafter, the present invention is described in more detail based on Examples and Comparative Examples. The present invention is not limited to the following Examples.

Example 1

(Preparation of Organic Semiconductor Device)

By using a phenyl naphthalene derivative (2-(4'-pentylphenyl)-6-methoxynaphthalene. Hereinafter, this may be abbreviated as 5-PNP-O1.), which is the compound shown in the above chemical formula 47, as the organic semiconductor material, the organic semiconductor device comprising substrate/gate electrode/gate-insulating layer (also serving as an liquid crystal alignment layer)/source-drain electrodes/organic semiconductor layer (/protective layer) was prepared.

<Substrate> A glass substrate (thickness: 1.1 mm, Corning 1737) subjected to ultrasonic cleanings by using a neutral detergent, pure water, acetone and IPA in this order was used.

<Gate electrode> The gate electrode was formed on the substrate by resistance heating depositing a strap-shaped pattern (electrode width, 100 μm, between electrodes: 5 mm) of Au (thickness: 300 nm) via a metal mask, A similar electrode pattern can be formed by patterning an ITO electrode by using a wet process.

<Gate-Insulating Layer and Alignment Treatment Thereof>

(a) Case in which component molecule of organic semiconductor material is aligned in parallel to substrate surface (refer to FIG. 2); as the gate-insulating layer, a photosensitive polyimide (wherein 10 g of Toray Industries Inc.: UR-3140 is diluted with 25 g of n-methylpyrolidone) was spin coated, and a terminal of the gate electrode was bared by a light-exposure development after drying at 100° C. Then, after calcinations at the maximum temperature of 350° C., the gate-insulating layer of 300 nm film thickness was formed.

The surface of the polyimide film thus formed was subjected to an alignment treatment by rubbing (using polyester rapped around a 48 mm roller as a rubbing cloth, 1200 rpm, substrate moving speed of 600 mm/min). The rubbing direction was orthogonal to the channel length direction (charge transporting direction).

(b) Case in which component molecule of liquid crystalline organic semiconductor material is aligned in perpendicular (that is, right angle direction to substrate surface) to substrate surface (refer to FIG. 1); On the substrate provided with the electrodes, $SiO_2$ film of 100 nm was formed by RF spattering (output: 100 W×30 min). On this substrate, since the liquid crystalline organic semiconductor material used in this Example is perpendicularly aligned, when constituting TFT, a charge, which is transported in a direction perpendicular to a molecular major axis, will be dominant.

<Source• Drain Electrodes>

Using a metal mask, Au was formed by resistance heating deposition (electrode thickness: 100 nm) as source• drain electrodes (channel length: 50 μm, channel width: 4 mm). For an extraction electrode from the source• drain electrode pad, Al was used.

<Organic Semiconductor Layer>

As the liquid crystalline organic semiconductor material, 5-PNP-O1 was used. By vapor deposition using a metal mask, this liquid crystalline organic semiconductor material was formed into a 50 nm thickness coated film. This coated film was formed in a configuration so that channels of 4 mm×10

μm rectangular-pattern are formed in between the source•drain formed in the above. After turning this coated film into the nematic liquid crystal phase, by turning this coated film into the isotropic phase by heating and then lowering the temperature, the coated film was supercooled to around 105° C. at a speed of 1° C./min. When crystallization has begun partially, the temperature was raised to 118° C. at a speed of 20° C./min, and by maintaining this temperature, the organic semiconductor layer in the crystal phase was obtained.

(Formation of Organic Semiconductor Layer for Each Property Evaluation)

The organic semiconductor material 5-PNP-O1 was coated on a substrate, this coated film was turned into the nematic liquid crystal phase by turning this coated film into isotropic state by heating and then lowering the temperature. Then, the coated film was supercooled to around 105° C. at a speed of 1° C./min. When crystallization has begun partially, the temperature was raised to 118° C. at a speed of 20° C./min, and by maintaining this temperature until the coated film is in the crystal state, the organic semiconductor layer of Example 1 was formed. Using this organic semiconductor layer, each of the following property evaluation was carried out.

Example 2

As the liquid crystalline organic semiconductor material, 2-(4'-octylphenyl)-6-butyloxynaphthalene (abbreviated as 8-PNP-O4) shown in the above chemical formula 40 was used. Then, a sandwich cell, which was prepared by sticking two substrates provided with patterned ITO electrodes (electrode size: 4 mm×4 mm) together with 9 μm of cell gap, was heated to 150° C. In this sandwich cell, the liquid crystalline organic semiconductor material 8-PNP-O4 in the isotropic phase state was injected by the capillary phenomenon. Then, the liquid crystalline organic semiconductor material was supercooled, from the isotropic state, to around 115° C. at a speed of 1° C./min. When grain formation of the smectic liquid crystal phase has begun partially, the temperature was raised to 140° C. at a speed of 20° C./min, and by maintaining this temperature until the material is in the smectic liquid crystal state, the organic semiconductor layer of Example 2 was formed. In this organic semiconductor layer, grains over approximately 2 to 4 mm square were formed. In this organic semiconductor layer, after exhibiting the smectic liquid crystal phase (SmE phase) state, the phase was transferred to the crystal phase by ccooling, and the organic semiconductor layer exhibits the crystal state at room temperature. Using this organic semiconductor layer, temperature dependency of charge transport property was evaluated by the following method.

Example 3

As the liquid crystalline organic semiconductor material, 2-(4'-octyloxyphenyl)-6-butyloxybenzothiazole (abbreviated as 8O-PBT-O4) shown in the above chemical formula 48 was used. Then, a sandwich cell was prepared by sticking two substrates, provided with patterned ITO electrodes, together with 9 μm of cell gap. After that, this sandwich cell was heated to 150° C. In this cell, the liquid crystalline organic semiconductor material 8O-PBT-O4 in the isotropic phase state was injected by the capillary phenomenon. Then, the liquid crystalline organic semiconductor material was supercooled, from the isotropic state, to around 100° C. at a speed of 1° C./min. When grain formation of the smectic liquid crystal phase has begun partially, the temperature was raised to 103° C. at a speed of 20° C./min, and by maintaining this temperature, the organic semiconductor layer of Example 3 was formed. This material turned into the nematic liquid crystal state during the supercooling process, and the phase was transferred from the nematic liquid crystal state to the smectic liquid crystal phase (SmC phase). In this organic semiconductor layer, grains over approximately 2 to 4 mm square were formed. In this organic semiconductor layer, after exhibiting the smectic liquid crystal phase (SmC phase) state, the phase was transferred to the crystal phase by ccooling, and the organic semiconductor layer exhibits the crystal state at room temperature. Using this organic semiconductor layer, temperature dependency of charge transport property was evaluated by the following method.

Comparative Example 1

Instead of the method for forming the organic semiconductor layer of Example 1, the organic semiconductor layer of Comparative Example 1 was formed by: coating the same organic semiconductor material as in Example 1 on a substrate; raising temperature thereof to over 105° C. so that the material will be a melt; and then, lowering the temperature to turn the material into the crystal state. By using this organic semiconductor layer, each of the following evaluation was carried out.

Comparative Example 2

In the method for forming organic semiconductor layer of Example 2, the liquid crystalline organic semiconductor material injected into the cell was cooled, from the isotropic state, at a speed of 5° C./min. The organic semiconductor layer of Comparative Example 2 was formed by turning the material into the smectic liquid crystal (SmA phase) state without turning the material into the state I described above. In this organic semiconductor layer, after exhibiting the smectic liquid crystal phase (SmE phase) by cooling, the phase was transferred to the crystal phase by further cooling, and the organic semiconductor layer exhibits the crystal state at room temperature. Using this organic semiconductor layer, temperature dependency of charge transport property was evaluated by the following method.

Comparative Example 3

In the method for forming organic semiconductor layer of Example 3, the liquid crystalline organic semiconductor material injected into the cell was cooled, from the isotropic state, at a speed of 5° C./min. The organic semiconductor layer of Comparative Example 3 was formed by turning the material from the nematic liquid crystal state into the smectic liquid crystal (SmC phase) state without turning the material into the state I described above. In this organic semiconductor layer, after exhibiting the smectic liquid crystal phase (SmC phase), the phase was transferred to the crystal phase by cooling, and the organic semiconductor layer exhibits the crystal state at room temperature. Using this organic semiconductor layer, temperature dependency of charge transport property was evaluated by the following method.

(Evaluation of Crystal State)

Figure 3:
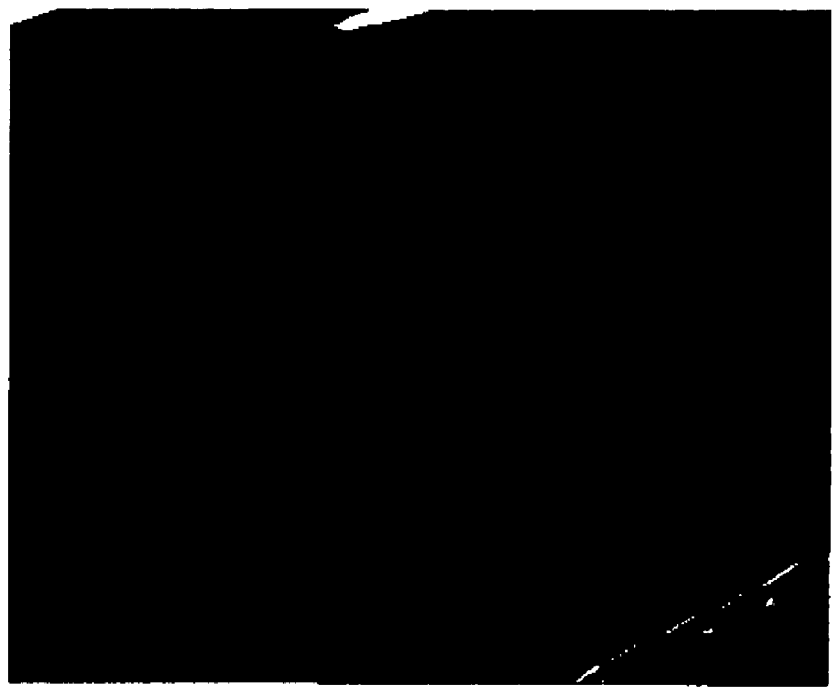
FIG. 3 is a photograph by a polarizing microscope of the organic semiconductor layer in Example 1.
Figure 4:
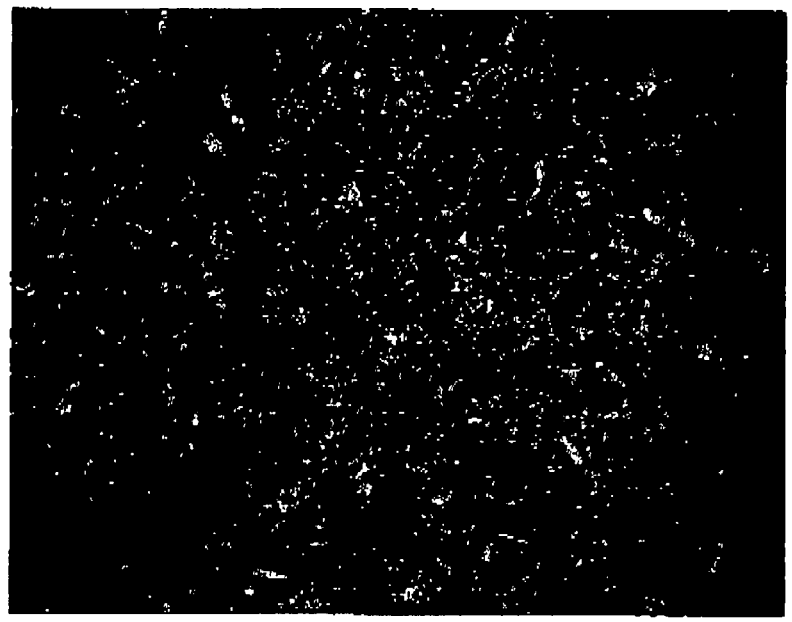
FIG. 4 is a photograph by a polarizing microscope of the organic semiconductor layer in Comparative Example 1.

To evaluate the crystal state of the organic semiconductor layer, photographs by a polarizing microscope of the organic semiconductor layer in Example 1 and the organic semiconductor layer in Comparative Example 1 were observed. This observation was carried out using a polarizing microscope (manufactured by Nikon Corporation, model number: OPTIPHOT2-POL). FIG. 3 is a photograph by a polarizing microscope of the organic semiconductor layer in Example 1, and FIG. 4 is a photograph by a polarizing microscope of the organic semiconductor layer in Comparative Example 1.

The organic semiconductor layer in Comparative Example 1 is low in transparency so that it is thought to be in minute crystal state. However, the organic semiconductor layer in Example 1 is high in transparency, and it is clear that the layer is formed from crystals of large area.

(Evaluation of Structural Defect Density)

Figure 5:
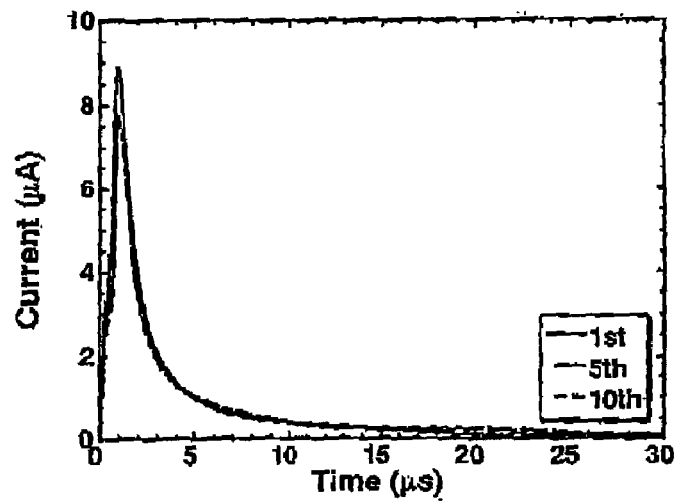
FIG. 5 is a graph showing variation of transient photocurrent waveform by pulse light irradiation of the organic semiconductor layer in Example 1.
Figure 6:
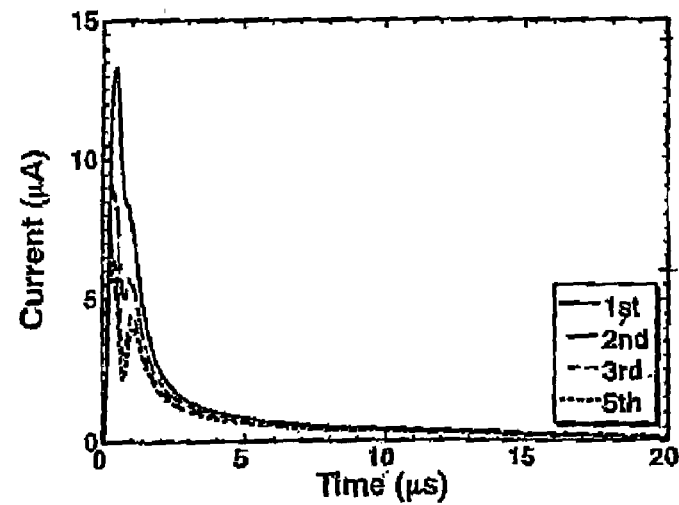
FIG. 6 is a graph showing variation of transient photocurrent waveform by pulse light irradiation of the organic semiconductor layer in Comparative Example 1.

To evaluate structural defect density of the organic semiconductor layer of this organic semiconductor device qualitatively, variation of transient photocurrent waveform by pulse light irradiation of the organic semiconductor layer in Example 1 and Comparative Example 1 were investigated. This evaluation was carried out using a method in which the organic semiconductor layers are formed, according to each method for forming in Example 1 and Comparative Example 1, using Al facing electrode cell (cell gap: 7 μm, electrode size: 4 mm×4 mm), and these samples are excited by N2 pulse laser of 337 nm wavelength (irradiating energy: 60 μJ). FIG. 5 is a graph showing variation of transient photocurrent waveform by pulse light irradiation of the organic semiconductor layer in Example 1, and FIG. 6 is a graph showing variation of transient photocurrent waveform by pulse light irradiation of the organic semiconductor layer in Comparative Example 1.

In Comparative Example 1, the waveform became smaller after each irradiation. However, in Example 1, almost no change has occurred. The reason of the waveform becoming smaller after each irradiation is considered that, because electric field distribution is changed due to photoproduction carrier being trapped by the structural defects in the crystal, the value of the transient photocurrent is decreased by each pulse light irradiation. Therefore, it can be said that, compared to the structural defect density of the organic semiconductor layer in Comparative Example 1, the structural defect density of the organic semiconductor layer in Example 1 is lower. Further, compared to the organic semiconductor layer in Comparative Example 1, it is clear that the organic semiconductor layer in Example 1 has uniform charge transport property.

(Evaluation of Charge Transport Property)

The charge mobility of the organic semiconductor layer in Example 1 was measured by TOF method (time of flight method). This measurement was carried out using a method in which the organic semiconductor layer is formed, according to each method for forming in Example 1, using ITO facing electrode cell (cell gap: 9 μm, electrode size: 10 mm×5 mm), and the sample is excited by N2 pulse laser of 337 nm wavelength (irradiating energy: 12 μJ). As the results, the charge mobility of the organic semiconductor layer in Example 1 was $4 \times 10^{-2} cm^2 V^{-1} s^{-1}$.

(Evaluation of Temperature Dependency of Charge Transport Property)

Figure 7:
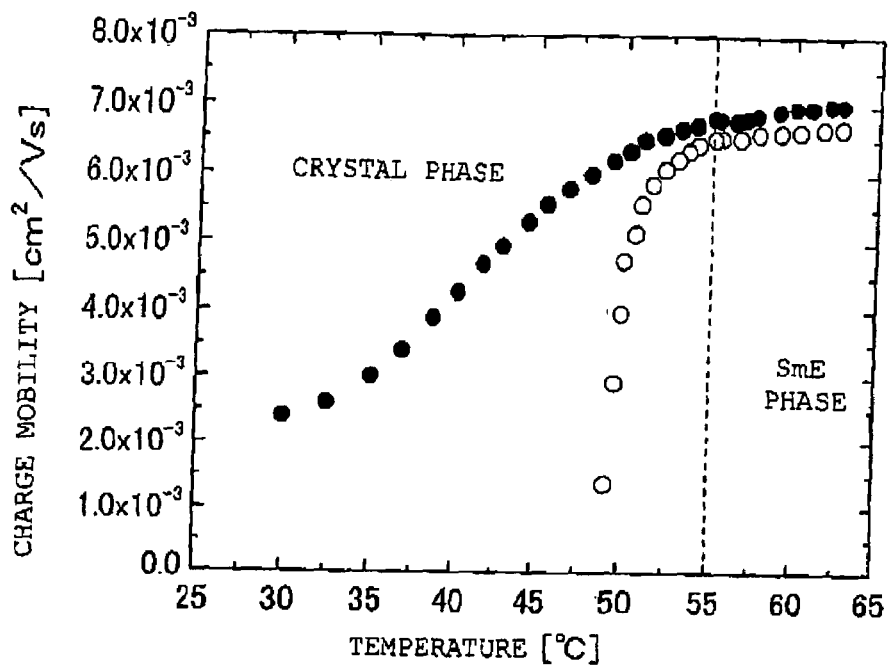
FIG. 7 is a graph showing temperature dependency of charge transport property of the organic semiconductor layer in Example 2 and Comparative Example 2.
Figure 8:
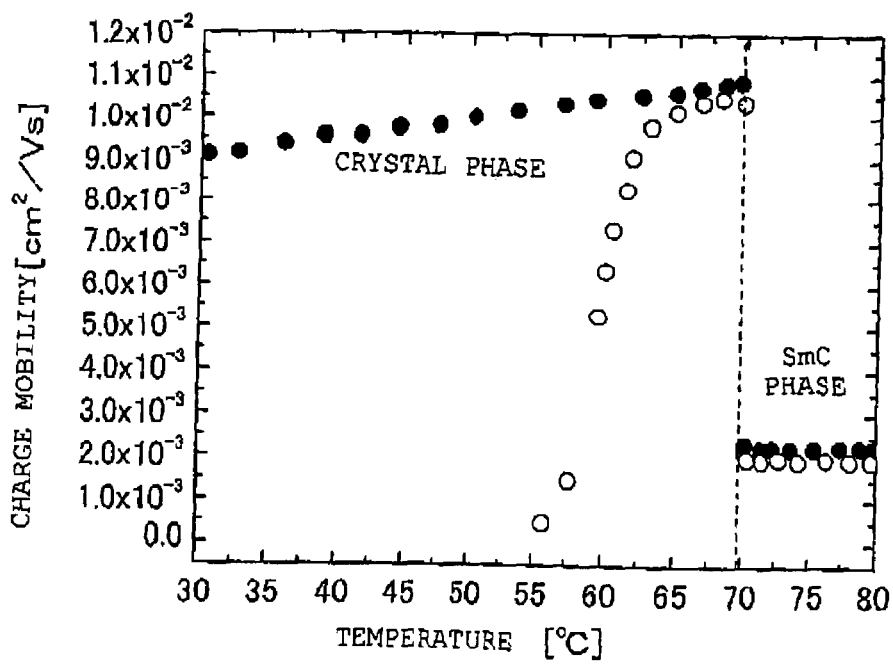
FIG. 8 is a graph showing temperature dependency of charge transport property of the organic semiconductor layer in Example 3 and Comparative Example 3.

The temperature dependency of charge transport property of the organic semiconductor layer in Example 2, 3 and Comparative Example 2, 3 was evaluated by TOF method. This evaluation was carried out by, in the TOF method by N2 pulse laser of 337 nm wavelength (irradiating energy: 60 μJ), using ITO facing electrode cell obtained in Examples and Comparative Examples, lowering the temperature from a state in which the organic semiconductor layer exhibiting the smectic liquid crystal phase, and observing the variation of the charge mobility to temperature variation. FIG. 7 is a graph showing temperature dependency of charge mobility of the organic semiconductor layer in Example 2 and Comparative Example 2, and FIG. 8 is a graph showing temperature dependency of charge mobility of the organic semiconductor layer in Example 3 and Comparative Example 3. In FIGS. 7 and 8, black dots are for each Example and white dots are for each Comparative Example.

The organic semiconductor layers in Comparative Example 2 and 3 were confirmed that, after the phase is transferred from the smectic liquid crystal phase to the crystal phase, the charge transport property is easily deteriorated by deep defect level due to volume shrinkage. In contrast, the organic semiconductor layers in Example 2 and 3 were confirmed that they perform function as charge transporting path without the charge transport property being completely deteriorated at room temperature (30° C.).

What is claimed is:

1. An organic semiconductor device comprising at least a substrate, a gate electrode, a gate-insulating layer, an organic semiconductor layer in a crystallized crystal state, a drain electrode, and a source electrode, wherein the organic semiconductor layer is formed from an organic semiconductor material comprising a liquid crystal molecule, and exhibits a phase having periodic regularity at a location of a center of gravity in between the liquid crystal molecules, and the liquid crystalline organic semiconductor material has properties capable of exhibiting a supercooled state during a phase transition process, in which a phase having no periodic regularity at a location of a center of gravity in between the liquid crystal molecules is capable of being transferred into a phase having periodic regularity at a location of a center of gravity in between the liquid crystal molecules, and also, the phase of the material is capable of being transferred from said supercooled state to the phase having periodic regularity at a location of a center of gravity in between the liquid crystal molecules, and wherein the phase having no periodic regularity at a location of a center of gravity in between the liquid crystal molecules is a nematic liquid crystal phase and the phase having periodic regularity at a location of a center of gravity in between the liquid crystal molecules is a crystal phase.

2. The organic semiconductor device according to claim 1, wherein the drain electrode and the source electrode are formed on the gate-insulating layer so that the drain electrode and the source electrode are facing to each other, the organic semiconductor layer is formed in between the drain electrode and the source electrode, and the liquid crystal molecule in the liquid crystalline organic semiconductor material is aligned in parallel to a film thickness direction of the drain electrode and the source electrode.

3. The organic semiconductor device according to claim 1, wherein the drain electrode and the source electrode are formed on the gate-insulating layer so that the drain electrode and the source electrode are facing to each other, the organic semiconductor layer is formed in between the drain electrode and the source electrode, and the liquid crystal molecule in the liquid crystalline organic semiconductor material is aligned in orthogonal to a film thickness direction of the drain electrode and the source electrode, also standing abreast in between the drain electrode and the source electrode.

* * * * *